United States Patent
Kim

(10) Patent No.: US 8,866,009 B2
(45) Date of Patent: Oct. 21, 2014

(54) ORDERED SUPRAMOLECULAR SYSTEM FOR ORGANIC PHOTOVOLTAICS

(75) Inventor: Oh-Kil Kim, Burke, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 939 days.

(21) Appl. No.: 12/357,470

(22) Filed: Jan. 22, 2009

(65) Prior Publication Data

US 2009/0188564 A1 Jul. 30, 2009

Related U.S. Application Data

(60) Provisional application No. 61/022,582, filed on Jan. 22, 2008.

(51) Int. Cl.
| | | |
|---|---|---|
| *H01L 31/00* | (2006.01) | |
| *A01K 1/015* | (2006.01) | |
| *G11B 11/105* | (2006.01) | |
| *B82Y 10/00* | (2011.01) | |
| *H01L 51/00* | (2006.01) | |
| *H01L 51/42* | (2006.01) | |

(52) U.S. Cl.
CPC ............ *H01L 51/0093* (2013.01); *B82Y 10/00* (2013.01); *H01L 51/0064* (2013.01); *Y02E 10/549* (2013.01); *H01L 51/0067* (2013.01); *H01L 51/42* (2013.01)
USPC ............................ 136/263; 428/221; 428/332

(58) Field of Classification Search
USPC ............. 136/263; 252/182.12, 182.3, 182.31, 252/582; 428/221, 332, 409, 411.1; 385/122
See application file for complete search history.

(56) References Cited

U.S. PATENT DOCUMENTS 5,763,066 A 6/1998 Kim et al.

OTHER PUBLICATIONS

Kim, Super-Helix Formation induced by cyanine J-aggregates onto random-coil carboxymethyl amylose as template, 2006, J. Am. Chem. Soc. 128, 510-516.*
Kim, One-dimensional Energy/Electron transfer through a helical channel, 2006, J. Am. Chem. Soc. 128, 4532-4533.*
Kim, Seond-harmonic generation by spontaneous self-polig of suptramolecular thin films of an amylose-dye inclusion complex, 1996, J. Am. Chem. Soc. 118, 12220-12221.*
Pepitone, Synthesis and Characterization of Donor-Acceptor Chromophores for Unidirectional Electron Transfer, 2007, Org. Lett. vol. 9 801-804.*
Kim et al., "Super-Helix Formation Induced by Cyanine J-Aggregates onto Random-Coil Carboxymethyl Amylose as Template" J. Am. Chem. Soc., 128(2), 510-516 (2006).
Kim et al. "Supramolecular Device for Artificial Photosynthetic Mimics as Helix-Mediated Antenna/Reaction Center Ensemble" Org. Lett., 10(8), 1625-1628 (2008).
Kim et al., "Second-Harmonic Generation by Spontaneous Self-Poling of Supramolecular Thin Films of an Amylose-Dye Inclusion Complex" J. Am. Chem. Soc., 118, 12220-12221 (1996).
Kim et al., "One-Dimensional Energy/Electron Transfer through a Helical Channel" J. Am. Chem. Soc., 128(14), 4532-4533 (2006).
Pepitone et al., "Synthesis and Characterization of Donor-Acceptor Chromophores for Unidirectional Electron Transfer" Org. Lett., 9(5), 801-804 (2007).

* cited by examiner

*Primary Examiner* — Monique Peets
(74) *Attorney, Agent, or Firm* — US Naval Research Laboratory; Joseph T. Grunkemeyer

(57) ABSTRACT

A structure having: a molecule of carboxymethyl amylose (CMA) in a super-helical conformation; cyanine molecules on the exterior surface of the CMA arranged in a J-aggregate formation; and a chromophore molecule in the interior space of the CMA.

7 Claims, 9 Drawing Sheets

ORDERED SUPRAMOLECULAR SYSTEM FOR ORGANIC PHOTOVOLTAICS

This application claims the benefit of U.S. Provisional Patent Application No. 61/022,582, filed Jan. 22, 2008. This provisional application and all other publications and patent documents referenced throughout this nonprovisional application are incorporated herein by reference.

TECHNICAL FIELD

The disclosed subject matter is generally related to organic photovoltaic devices.

DESCRIPTION OF RELATED ART

Photovoltaic solar cells are devices to convert photoenergy to electric energy. The conversion efficiency depends at least partially on materials systems and material configurations in the device. There have been reported numerous photovoltaic solar cell devices, whose configurations vary, depending on device materials/components. The basic principle is that excitation of a sensitizer, either D or A, electron/hole separation of chromophores and transport of the charges to opposite electrodes. Many organic solar cell materials are based on a D/A pair of organic/polymer semiconductors and on a hybrid system comprising a D-organic/polymer and an inorganic semiconductor. They are mostly used for a solid state device of a p-n junction made with D/A layers or D/A materials blended in a single layer, and subsequently sandwiched by a pair of electrodes. Some of the typical systems are poly(3-octylphenylthiophene)/poly(3-(2-ethylhexyloxy)-6-methoxyphenylen-2-cyanovinylene) (Granstrom et al., *Nature*, 395, 257 (1998)), poly(3-hexylthiophene)/cadmium selenide (CdSe) dispersion (Huynh et al., *Science*, 295, 2425 (2002)) and dye/$TiO_2$ hybrid system, together with hole-transporting polymers (Bach et al., *Nature*, 395, 583 (1998)). There are also some liquid solar cells based on a single molecular self-assembly of D-A chromophores such as porphyrin/$C_{60}$ (Imahori et al., *Adv. Mater.*, 9, 537 (1997)).

BRIEF SUMMARY

Disclosed herein is a structure comprising: a molecule of carboxymethyl amylose in a helical conformation having an exterior (helical) surface and an interior space; a plurality of cyanine molecules on the exterior surface arranged in a J-aggregate formation; and a chromophore molecule in the interior space (helical torus).

BRIEF DESCRIPTION OF THE DRAWINGS

A more complete appreciation of the invention will be readily obtained by reference to the following Description of the Example Embodiments and the accompanying drawings.

DETAILED DESCRIPTION OF EXAMPLE EMBODIMENTS

In the following description, for purposes of explanation and not limitation, specific details are set forth in order to provide a thorough understanding of the present disclosure. However, it will be apparent to one skilled in the art that the present subject matter may be practiced in other embodiments that depart from these specific details. In other instances, detailed descriptions of well-known methods and devices are omitted so as to not obscure the present disclosure with unnecessary detail.

Disclosed herein is an ordered supramolecular material system for organic photovoltaic nanodevices. The supramolecule may generally be constructed by encapsulation of an electron-donor (D)/acceptor (A) chromophore with helical amylose such that efficient energy/electrons transport takes place single molecularly and unidirectionally along the helical axis.

The supramolecule may resemble a natural photosynthetic reaction center, in that photoexcitation is transferred efficiently and directionally through the photosynthetic unit, along with a long lifetime of the charge separation. In this regard, the natural photosynthetic unit is the biological equivalent of a solar cell, and works with high efficiency and high adaptability such that the energy of the sunlight is converted within 100 ps with a quantum yield of 95% into a chemical potential.

The high transport efficiency and the unidirectional transport of energy/electrons may be realized by encapsulating a D/A chain chromophore with helical amylose, in that the chromophore is a single molecular entity confined in a quenching-free environment, attaining a high quantum efficiency in solution. Charge transport takes place by energy transfer and subsequent electron transfer processes between D-A subunits inside the helix.

The light-harvesting is operated by another chromophore (antenna) bound to the same amylose helix. The functional role of the dye molecules as J-aggregates is to funnel the harvested energy to the chromophore confined inside the helix. In this way, the whole processes; collection and funneling of the photoenergy, transport of the energy inside the helix and subsequent charge separation as an electronic energy, are operated in the single supramolecular entity.

J-aggregation is understood as occurring due to the end-to-end stacking of dye monomers, and the aggregate absorption is known typically as a sharp, narrow band red-shifted from that of the monomer, while H-aggregates are due to a face-to-face stacking of monomers and appear most commonly as a broad blue-shifted band relative to the monomer band.

Figure 1:
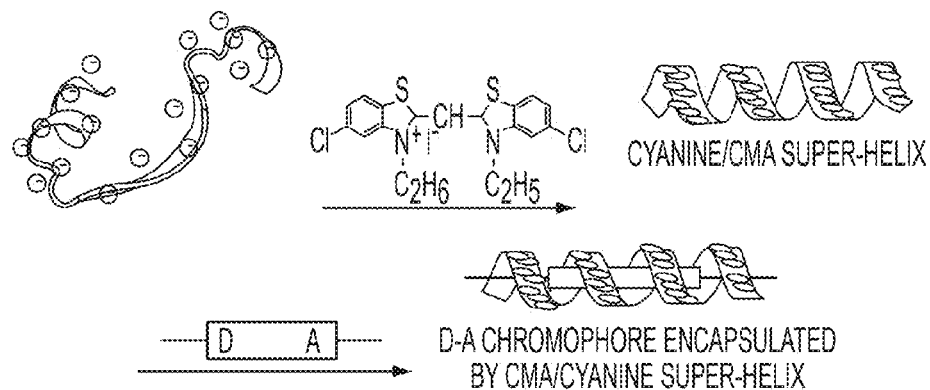
FIG. 1 schematically illustrates the self-assembly of a supramolecular structure.
Figure 2:
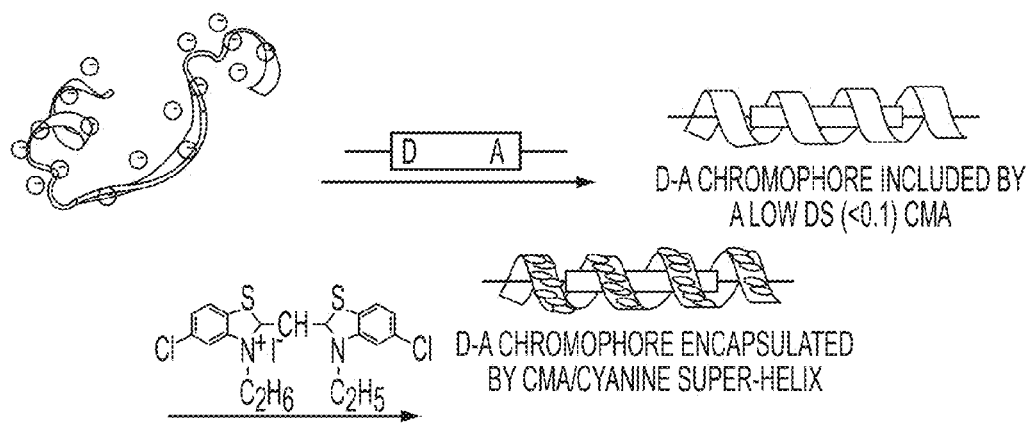
FIG. 2 schematically illustrates an alternate method of self-assembly of a supramolecular structure.

Binding of a cyanine dye to the external surface of the helix can occur spontaneously by self-organization (J-aggregation) of the dye molecules in the presence of random-coil carboxymethylated amylose (CMA), and the cyanine dye-amylose complex (Kim et al, *J. Am. Chem. Soc.,* 128, 510 (2006) and Supporting Information) is subsequently treated with a D/A chain chromophore to complete the supramolecular nanodevice (FIG. 1). Consequently, the electron-transfer component (D-A) is surrounded by an array of cyanine J-aggregates (antenna), analogous to the photosynthetic reaction center (LH1). Alternatively, the cyanine may be added after the chromophore (FIG. 2). The structures of CMA, cyanine-1, and several chromophores are shown below. In CMA, the acidic H may be replaced by $Na^+$ or other cation. The values of x and y are the proportion of the two monomers, rather than representing blocks of the monomers, such that x+y=1. The ratio DS is the average number of carboxymethyl substitutions per glucose unit. The structure below shows the most preferred substitution site, but when DS is high enough (e.g., >1), more than one OH groups in the same glucose unit may also be substituted. Other cyanines containing a $N^+$ atom may also be suitable. In DASP-($C_6$—V—$C_{12}$), the $(CH_2)_6$ group may also be any other linear alkylene. In OPV-($C_n$—V—$C_m$), n may be a positive integer such as 1, 2, or 3, and R may be HA or an organic group.

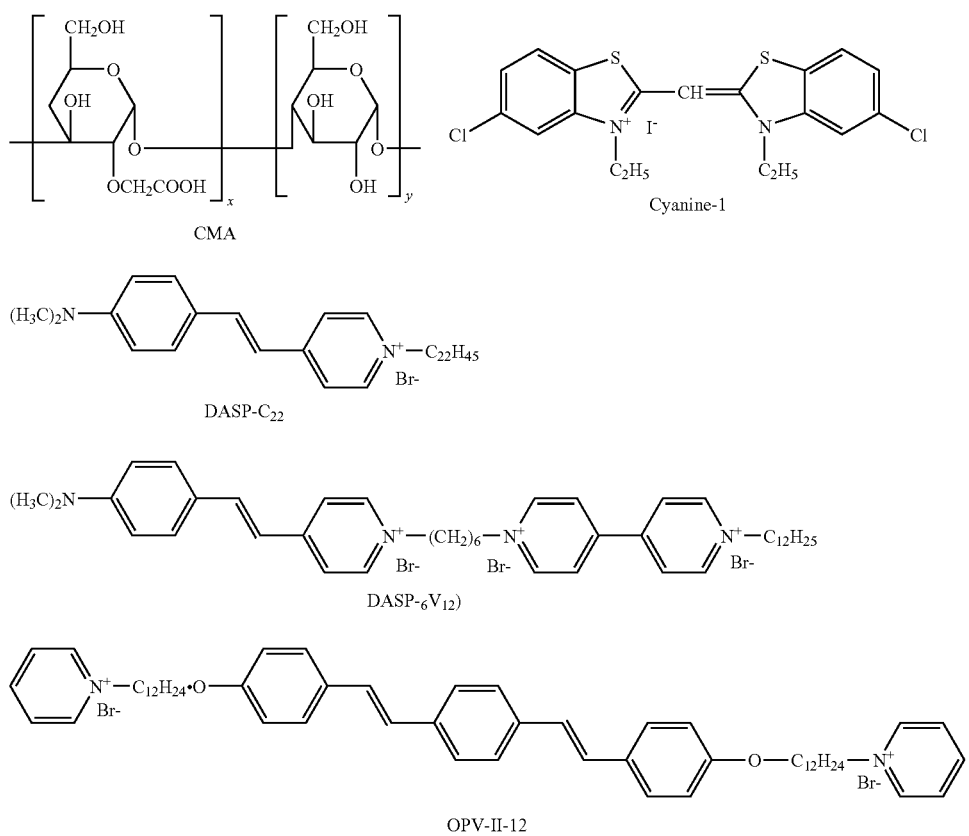

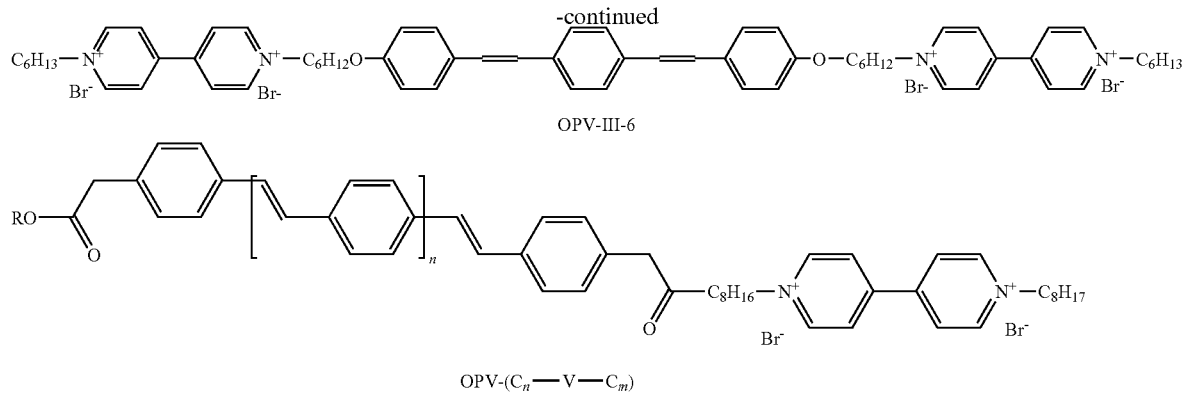

OPV-III-6

OPV-($C_n$—V—$C_m$)

Figure 6:
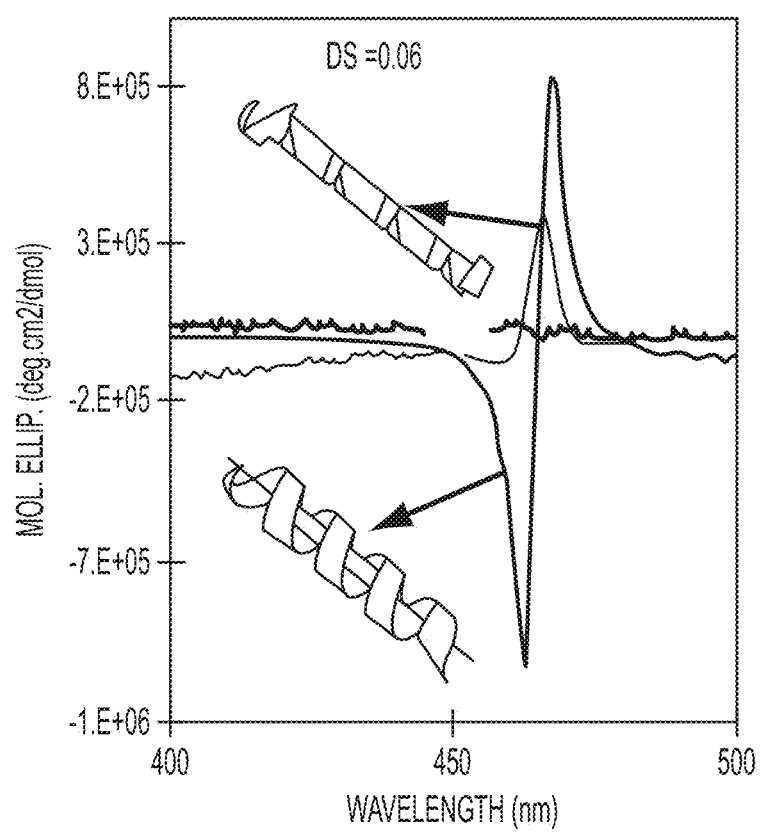
FIG. 6 shows a different CD intensity in the cyanine J-aggregates, reflecting the state of the super-helix with CMA (DS=0.06).

For CMA, it is almost impossible to assume a helical conformation by itself, and even with an extremely low degree (e.g., DS=0.06) of carboxymethylation, the helical encapsulation of DASP, for example, is significantly decreased compared to that of neutral amylose, such that at a higher DS (>0.1), CMA loses the inclusion capability completely. However, when the higher DS, random-coil CMA is transformed into a super-helix by cyanine J-aggregation, it turns out perfectly capable of encapsulating DASP-$C_{22}$ and even DASP-$_6V_{12}$; the latter reveals a particularly strong affinity for the highest DS (1.53) CMA super-helix, thereby rendering a remarkable stability (the supramolecular device prepared using the high DS (1.53) CMA super-helix were very stable such that their UV/vis and CD spectra in aqueous solution exhibited no significant changes at least for 1 month), while for the lowest DS (0.06) CMA super-helix, its charge interaction with DASP-$_6V_{12}$ is destructive, rendering the encapsulation detrimental (DASP-$_6V_{12}$ is very cooperative with the high DS (1.53) CMA superhelix for encapsulation. This may be associated with the tight super-helix structure). Accordingly, for a low DS (<0.1) CMA, the alternative route (FIG. 2) is preferred. The helical cyanine/CMA superstructure is already heavily twisted, but it becomes even more pronounced, as shown in FIG. 6, upon encapsulating a chromophore (DASP-C22). The helical conformation of CMA may have about 6 glucose units per helical turn. The turns may occur at about 10 Å spacing and have a diameter of about 10 Å.

Energy/electron-transfer (ET/eT) of D-A chromophores with helical encapsulation was investigated (based on the fluorescence intensity changes of D with and without A) in aq solution and compared with that of the encapsulation-free counterpart. With helical encapsulation, D-A chromophores (Kim et al., J. Am. Chem. Soc., 128, 4532 (2006)) showed a high ET/eT (>95%) and a clear dependence on D-A distance, while the encapsulation-free counterparts showed lesser than an order of magnitude in efficiency and no distance dependence. The antenna effect (photoenergy funneling) of cyanine J-aggregates on ET across the helix to a chromophore (DASP-C22) inside the helix was also investigated. It was about 98%. The overall transport efficiency from the antenna to the final eT for charge separation is >95%. This is an unusually high carrier transport.

Other than the high ET/eT efficiency, the helical supramolecule has a strong tendency (Kim et al. J. Am. Chem. Soc. 118, 12220 (1996); Pepitone et al., Org. Lett. 9, 801 (2007)) to self-assemble onto various substrates such as noble metals and metal oxides, depending on the type of the functional moiety at the chromophore end such as —SH and —COOH, respectively. Various thickness thin-films can be formed by a drop-casting or spin-casting of an aqueous solution, and the resulting films become insoluble due to lateral H-bonding between oriented amylose helices. In the solid films, the physical properties remain unchanged beside the enhanced photo/thermal stabilities.

Figure 9:
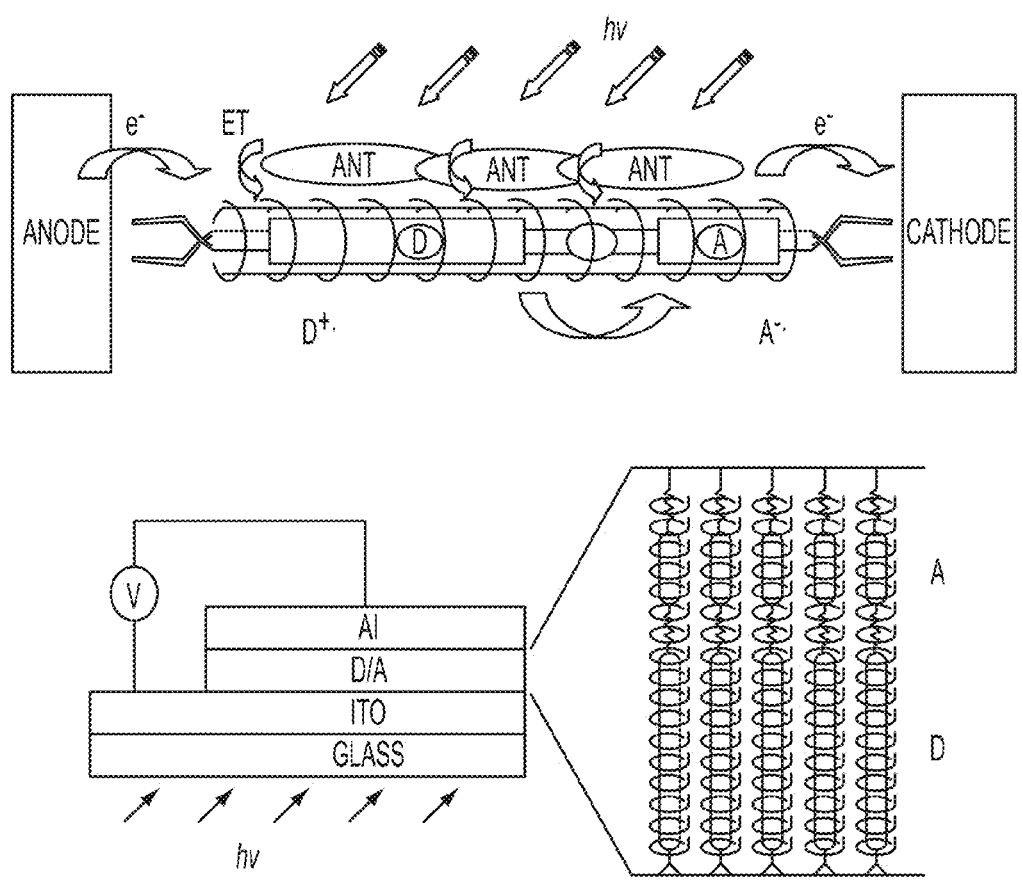
FIG. 9 schematically illustrates a single molecular feature of the supramolecule bound to a pair of electric contacts (top) and the supramolecular assembly in a photovoltaic cell (bottom, the helix-bound antenna (ANT) were omitted for clarification).

Since electron-transfer in the supramolecule is unidirectional, when the ends of the molecule are appropriately connected to a pair of redox contacts it becomes a single molecular photovoltaic cell. When a self-assembly thin-film is made and sandwiched with a pair of electrodes it becomes a single-layer nanodevice for a photovoltaic solar cell. Such a cell is illustrated in FIG. 9. For such devices, the CMA may need to be of a particular molecular weight or have a narrow range of molecular weight so that the coil has the proper length to encapsulate the chromophore while allowed the ends of the chromophore to contact the electrodes. For example, molecular weights from about 5000 to about 10,000 to about 20,000 may be suitable.

The supramolecule may be not only integrated structurally as well as functionally, but may also be capable of forming self-assembled thin films. The self-assembly occurs due to the interface interactions between the substrate surface and a functional unit at the end of the chromophore, so that a desirable functional group (for a specific substrate in mind) is introduced to the one end of the chromophores; such as —SH or $CH_3COS$— for gold surface, —$CO_2H$ for metal oxides, and —$N(CH_3)_2$ for a hydroxylated surface.

Figure 10:
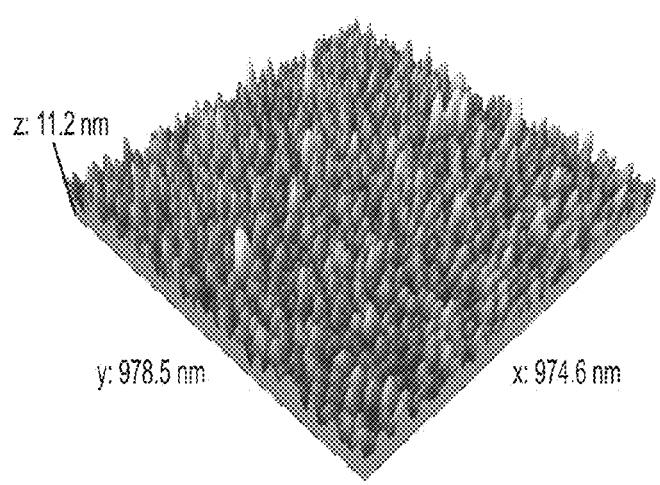
FIG. 10 shows an AFM image of the vertically aligned supramolecular assembly of DASP-$_{12}V_{16}$ on a hydroxylated Si surface.
Figure 10:
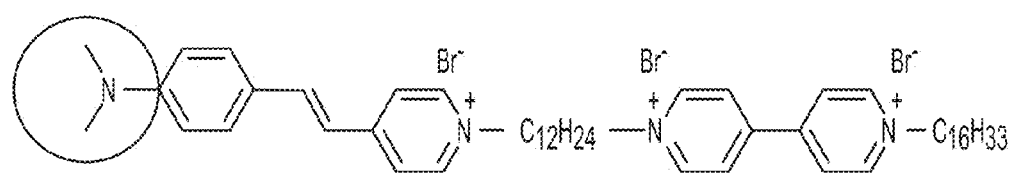
Figure 11:
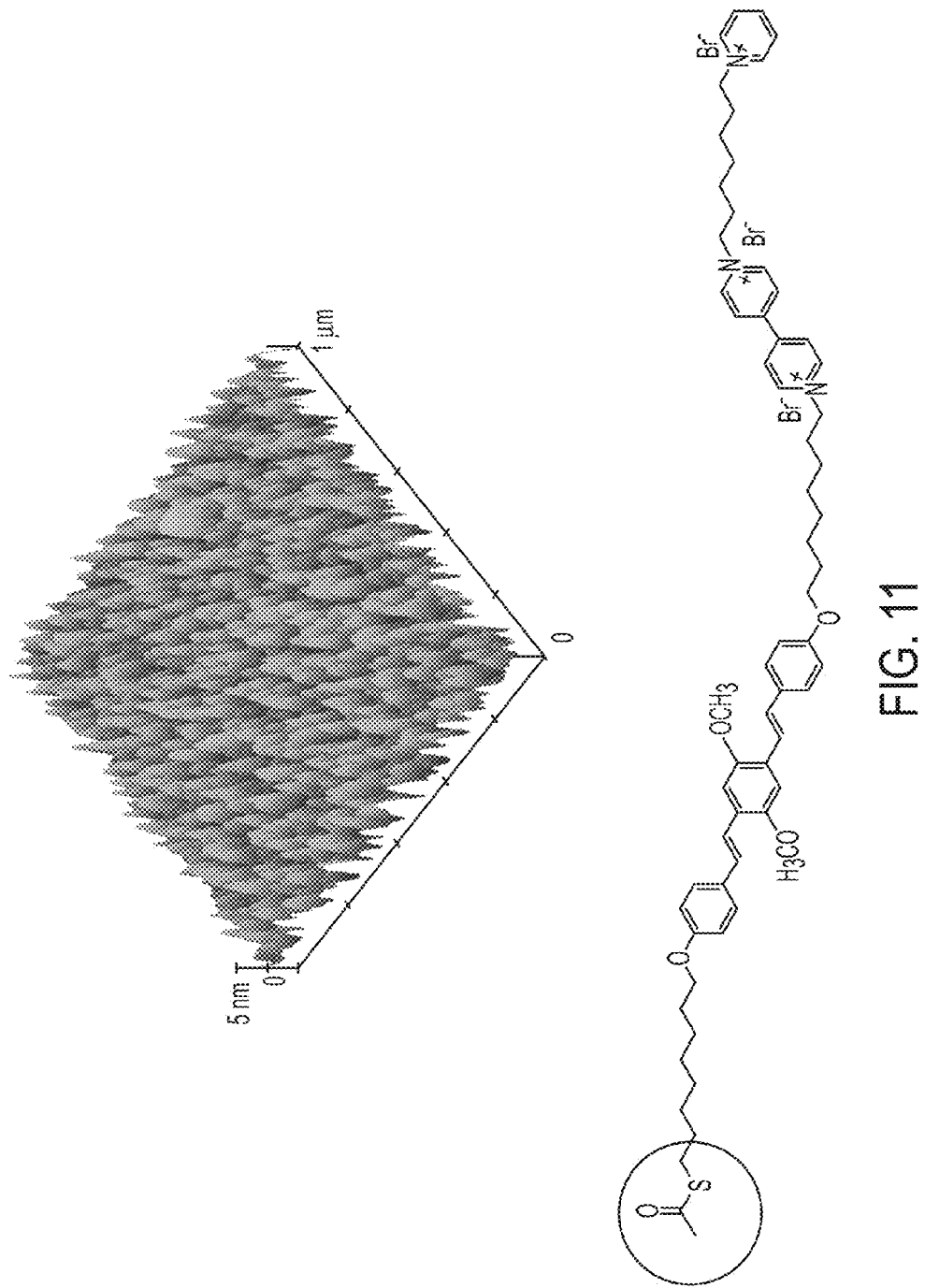
FIG. 11 shows AFM image of the vertically aligned supramolecular assembly of OPV-$_8V_7$ on a gold surface.

FIGS. 10 and 11 show representative chemical structures and their AFM (atomic force micrograph) images of self-assembled films to demonstrate how the individual functional unit (indicated using a circle) in the chromophore works for the specific substrates. FIG. 10 shows an AFM image of the vertically aligned supramolecular assembly of DASP-$_{12}V_{16}$ on a hydroxylated Si surface. FIG. 1 shows AFM image of the vertically aligned supramolecular assembly of OPV-$_8V_7$ on a gold surface. The length of alkyl linkers between chromophore units, and another at the chromophore tail has some influence on the self-assembly formation but suitable lengths may be in the range of C6~C16.

The following examples are given to illustrate specific applications. These specific examples are not intended to limit the scope of the disclosure in this application.

Supramolecular Device Processing:

A small volume of a stock solution ($10^{-3}$ M in DMSO) of Cyanine-1 (obtained from the Center for Photoinduced Charge Transfer, University of Rochester) and DASP-$C_{22}$ or DASP-$_6V_{12}$ (the synthetic details of DASP-$_6V_{12}$ was described by Pepitone et al., Org. Lett. 2007, 9, 801-804) was mixed with a large quantity (×100 times) of CMA (Kim et al., *J. Am. Chem. Soc.* 2006, 128, 510-516) solution ($10^{-3}$ M in water) with stirring for a few minutes. The supramolecule device was prepared through the two alternative, spontaneous self-organization processes (FIGS. 1 and 2) of the building blocks, in that the cyanine J-aggregation/CMA super-helix formation always requires to precede the inclusion of the chromophore, DASP-$C_{22}$ or DASP-Viologen (D-A) dye, when a high DS (>0.1) CMA was used. This procedure was particularly important where the highest DS (=1.53) CMA was used, since if the order was reversed (the addition of DASP-Viologen chromophore (to the CMA solution) precedes the cyanine dye), the high anionic surface charges of the CMA interacted preferentially with the dicationic viologene moiety such that the cyanine/CMA super-helix formation was interrupted. Conversely, for a low DS (<0.1) CMA, the reverse procedure worked better; the CMA was treated in advance with the DASP chromophore to process a loose helical inclusion (FIG. 3), which was then treated with the cyanine dye for J-aggregation.

Spectroscopic Determination:

Absorption/Fluorescence spectra: Absorption and emission spectra were recorded by using Cary UV-Vis-NIR Spectrometer (Varian) and DN3000 Fluorescence Spectrometer (SPEX Industries, Inc.), respectively. Circular Dichroism (CD) Spectra: CD sample solutions were recoded with Jasco J-500C Spectropolarimeter using 1-cm cylindrical quartz cell at 25° C. Time-Resolved Fluorescence Spectra: Fluorescence spectra were acquired using a Cary Eclipse fluorescence spectrometer and using 1 cm fused silica spectrophotometric cells. The fluorescence decays were measured using the technique of time-correlated single photon counting (TCSPC). Here the excitation source was a frequency-doubled femtosecond pulse train from a Ti:sapphire laser oscillator which was tuned to provide excitation pulses between 435-440 nm. The excitation power was attenuated to the point where there was no change in the fluorescence decay curves. The decay curves were measured using a polarizer set to the magic angle. The response time of the TCSPC system was determined to be about 40 picoseconds.

Figure 3:
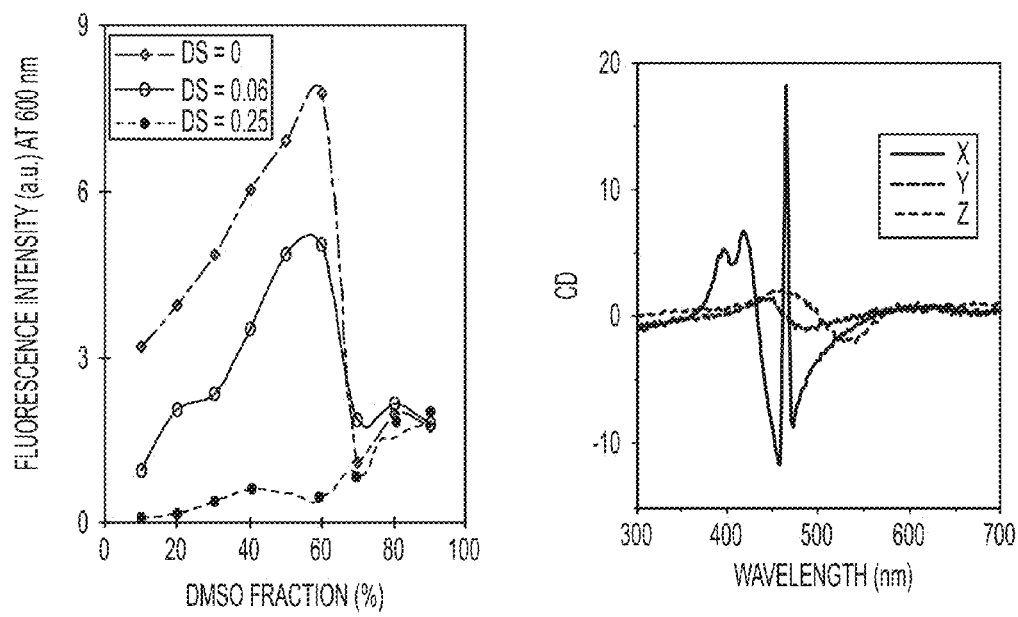
FIG. 3 shows: (left) dependence of fluorescence intensity (at $\lambda_{em}$=600 nm; excited at 485 nm) as a measure of helical inclusion of DASP-$C_{22}$ ($\lambda_{max}$=480 nm) on DS (degree of carboxymethylation) of amylose as well as DMSO/water mixture ratios; and (right) Induced CD (circular dichroism) spectra of DASP-$C_{22}$ included by; neutral amylose (z), 0.06 DS CMA (y), or the super-helix (x) of CMA (0.06 DS)/Cyanine-1. X: [CMA (0.06 DS)]/[Cyanine-1]/[DASP-$C_{22}$]. Y: [CMA (0.06 DS)]/[DASP-$C_{22}$]. Z: [Amylose]/[DASP-$C_{22}$]. [Cyanine-1]=[DASP-$C_{22}$]=1×10$^{-5}$ M, [CMA]=1×10$^{-3}$ M, and [Amylose]=3×10$^{-3}$ M in 40% DMSO.

FIG. 3 shows a comparison made based on the differences in the fluorescence intensity (at $\lambda_{em}$=600 m) since it has been commonly used as a measure of amylose encapsulation of DASP-$C_{22}$ under the optimum solvent condition (60% DMSO). As shown in the left graph, the fluorescence intensity for neutral amylose (DS=0) is the largest, and the carboxymethylated amylose (CMA) with 0.06 DS (degree of substitution) is somewhat comparable to that of neutral amylose, while CMA with 0.25 DS has lost completely the encapsulation capability.

A similar assessment can be made based on CD spectra. As shown in the right graph, the CD intensity (y) of the DASP-$C_{22}$ treated with CMA (0.06 DS) is somewhat comparable to that (z) of the DASP-$C_{22}$ treated with amylose. However, the CD intensity (x) of DASP-$C_{22}$ treated with the superhelix (CMA (0.06 DS)/cyanine J-aggregates) remained almost unchanged (only slightly disrupted), suggesting that the chromophores are largely encapsulated by the super-helix but some are encapsulated by the free CMA (0.06 DS). This seems indicated by broadening of the band before and after the sharp CD peak (475 nm of the J-band), which resembles that of the free CMA (0.06 DS) counterpart (y). Absorption band (y) of DASP-C22 included by the free CMA (0.06 DS) is blue-shifted compared to that (z) by neutral amylose.

Figure 4:
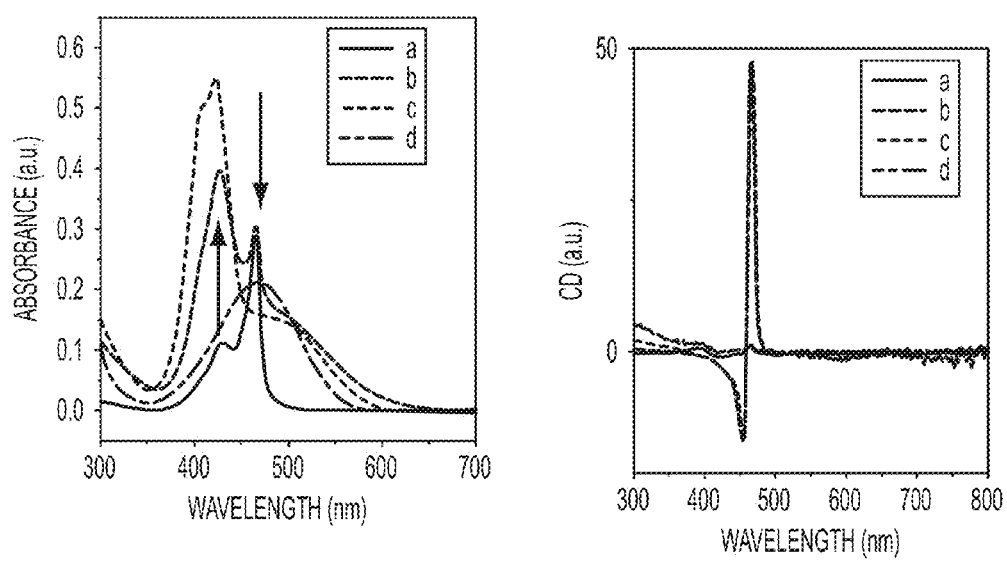
FIG. 4 shows: Absorption (left) and CD (right) spectra reflecting disruption of (CMA (0.06 DS)/Cyanine J-aggregates) super-helix by the presence of DASP-$_6V_{12}$: [CMA (0.06 DS)]=1×10$^{-3}$ M; [Cyanine-1]=1×10$^{-5}$ M; [DASP-$C_{22}$]=1×10$^{-4}$ M and [DASP-$_6V_{12}$]=1×10$^{-5}$ M. in water. (a), for CMA (0.06 DS)/Cyanine J-aggregates super-helix formation in water; (b), for the CMA (0.06 DS)/Cyanine J-aggregates super-helix encapsulating DASP-C22; (c), for a heavily disrupted super-helix (of CMA (0.06 DS)/Cyanine J-aggregates) by the presence of DASP-$_6V_{12}$ and (d), for DASP-$_6V_{12}$ aggregated in the presence of CMA (0.06 DS) alone (no inclusion). a: [CMA (0.06 DS)]/[Cyanine-1] b: [CMA (0.06 DS)]/[Cyanine-1]/[DASP-$C_{22}$] c: [CMA (0.06 DS)]/[Cyanine-1]/[DASP-$_6V_{12}$] d: [CMA (0.06 DS)]/[DASP-$_6V_{12}$]; [Cyanine-1]=1×10$^{-5}$ M, [CMA (0.06)]=1×10$^{-3}$ M, and [DASP-$C_{22}$]=[DASP-$_6V_{12}$]=1×10$^{-5}$ M.

The absorption spectra of week-old samples (FIG. 4) suggest that the cyanine J-bands (a, b and c at $\lambda_{max}$=465 nm) decreased about 50% (from the initial) and transformed markedly to monomeric dye (b and c at $\lambda_{max}$=425 min) and/or H-aggregates (c at $\lambda_{max}$=400 nm). The CD spectra suggest that the super-helix (a) remains undisrupted by including DASP-$C_{22}$ (b), while the super-helix (a) is totally disrupted (c) by the presence of DASP-$_6V_{12}$, being unable to include the chromophore, so that it resembles the free chromophore (d). As such, there exists a close correlation between the absorption and the CD spectra. Consequently, the encapsulation stability of the low DS (0.06) CMA/cyanine super-helix is strongly in contrast to that observed with the high DS (1.53) CMA super-helix (see the text). This may be associated with tightness of the super-helix structure in the latter.

The emission band (FIG. 5) of the encapsulated DASP-$_6V_{12}$ (c) is red-shifted by 15 nm compared to that of the free counterpart (d), as is observed in the absorption band. It is also noted that the extent of exciton quenching (broken arrows) of the DASP subunit by the viologen subunit ($_6V_{12}$) is consistent, regardless of the emission bands (475 nm for Cyanine J-band and 610 nm for DASP band) used for the measurement.

Free DASP (hemicyanine) chromophores are known to have an extremely low fluorescence quantum yield ($\Phi_f\approx 0.004$) in aqueous solution (Ephardt et al., *J. Phys. Chem.* 1993, 97, 4540; Fromherz, *J. Phys. Chem.* 1995, 99, 7188). This is most likely due to self-quenching resulting from aggregations and/or a nonradiative deactivation of the excited state by polar solvent. In previous studies (Pepitone et al., *Org. Lett.* 2007, 9, 801-804) on DASP-$_mV_{12}$ (m refers to the alkyl spacer length between D-A the chromophore), the same fluorescence properties were observed for the free chromophores, showing an extremely small residual fluorescence intensity (of DASP), as if a very large eT quenching occurred between DASP and $_mV_{12}$ subunits and yet, eT shows no dependence of distance (m). Such a behavior is a strong contrast to that observed for the helically encapsulated counterpart. As such, the extremely short fluorescence lifetime of $\tau_5$ (due to eT quenching of the free DASP-$_6V_{12}$ in the high DS (1.53) CMA solution) is attributable to the self-quenching resulting from aggregations and/or the solvent quenching, as mentioned above. Furthermore, it is even more likely that a strong electrostatic binding can occur between the multicationic DASP-$_6V_{12}$ and the multi-anionic CMA and thus, excitation of the free DASP (in a very low quantum yield) can be readily quenched out.

Figure 7:
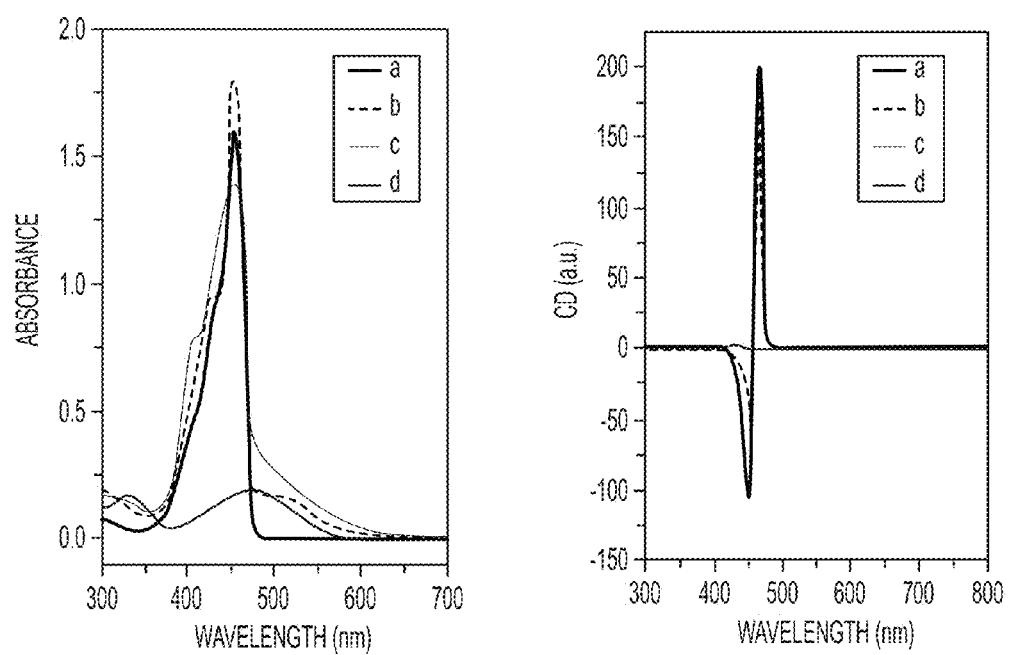
FIG. 7 shows absorption (left) and CD (right) spectra of cyanine J-aggregates/CMA (1.53 DS) super-helix: (a) super-helix alone (with no chromophore encapsulated), (b) DASP-$C_{22}$ encapsulating super-helix, (c) DASP-$_6V_{12}$ encapsulating super-helix, and (d) CMA (1.53 DS)/DASP-$_6V_{12}$ mixture; [cyanine]) 2.3×10$^{-5}$ M, [CMA (1.53 DS)]=0.9×10$^{-3}$ M, and [DASP-$C_{22}$]=[DASP-$_6V_{12}$]=1.7×10$^{-5}$ M in $H_2O$.

FIG. 7 (left) shows a strong absorption band at 460 nm (a, b, c) due to the cyanine J-aggregation of the super-helix (with 1.53 DS CMA), which is unaffected by the presence (encapsulation) of DASP-$C_{22}$ or DASP-$_6V_{12}$, and a weak and broad absorption band around 480 nm (d) for the free DASP-$_6V_{12}$ in a random-coil CMA (1.53 DS) solution. The peak position of DASP-$C_{22}$ is commonly red-shifted (Kim et al., *J. Am. Chem. Soc.* 1996, 118, 12220-12221) when encapsulated with amylose. By the same token, with the super-helix encapsulation the absorption band of DASP-$_6V_{12}$ (c) is red-shifted to 500 nm from 475 nm of the encapsulation-free counterpart (d). This is reflected in the fluorescence emission bands (see FIG. 8 inset and FIG. 5). The strong J-band as a proof of the super-helix encapsulation (b, c) is manifested by CD spectra (right) (There is a close correlation between the absorption and CD spectra (FIGS. 1 and 2) of DASP-$_6V_{12}$ in the presence and absence of the super-helix (based on the cyanine J-aggregation with a high DS (1.53) CMA)), in that the induced CD (of the J-aggregates) remains mostly unchanged by treating (encapsulating) DASP-$C_{22}$ (b) and DASP-$_6V_{12}$ (c). By contrast, the super-helix based on the lowest DS (0.06) CMA is disrupted (FIG. 4) by the presence of DASP-$_6V_{12}$ to monomeric cyanine (It is likely that the multiple-charges of DASP-$_6$V$_{12}$ override a relatively weak cyanine J-aggregation with the low DS (0.06) CMA.), losing the CD signal of the helical J-band.

Figure 5:
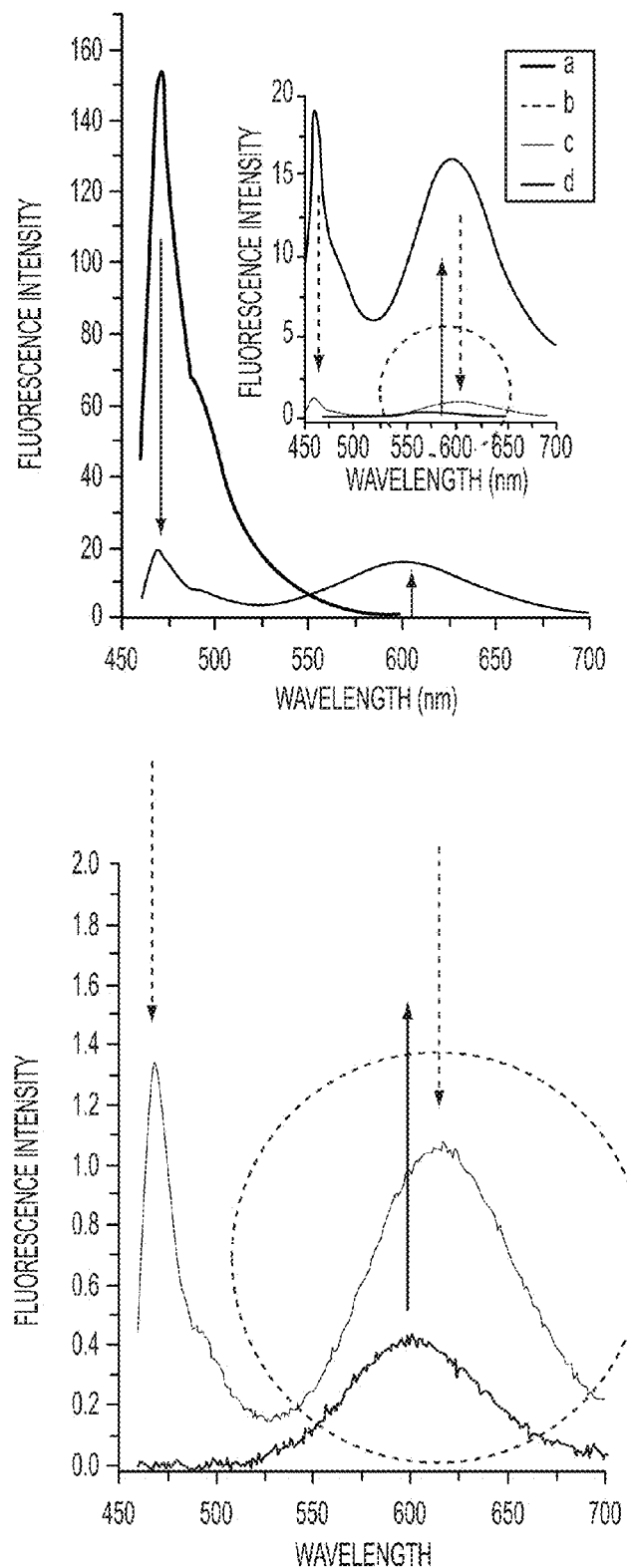
FIG. 5 shows the details of the emission bands of the DASP-$_6V_{12}$ in CMA (1.53 DS) solution of no encapsulation (d), and in encapsulation of the super-helix (c).

The fluorescence spectra (FIG. 8, left) provide conclusive evidence for the super-helical inclusion of DASP-C$_{22}$, which brings about a sharp fluorescence quenching (ca. 90%) of the J-aggregates at 475 nm, accompanying the concomitant enhancement (>×20) (Kim et al., *J. Am. Chem. Soc.* 2006, 128, 4532-4533) of DASP fluorescence (at 605 nm) due to ET (details in inset). A similar red-shift (15 nm) is observed for DASP-$_6$V$_{12}$ in the emission band due to the encapsulation (FIG. 5). When DASP-$_6$V$_{12}$ (instead of DASP-C$_{22}$) is encapsulated by the super-helix, the excited-state of the DASP moiety is almost completely quenched by eT of the viologen subunit ($_6$V$_{12}$) to a charge-separated state. The overall quenching efficiency along the pathways, from photoinduced ET from the antenna and the subsequent eT to DASP-$_6$V$_{12}$ is >90%.

Figure 8:
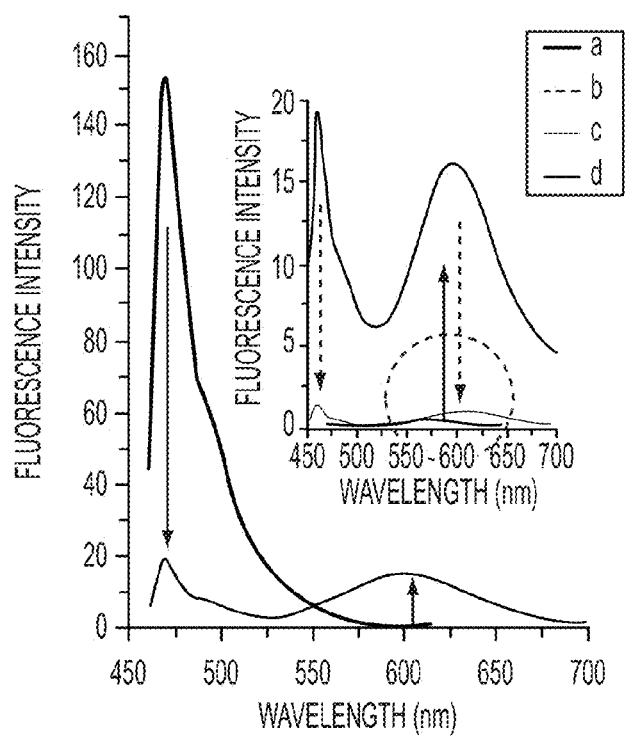
FIG. 8 shows (left) changes in the fluorescence intensity (at 475 nm, ex at 457 nm) (a) of cyanine J-aggregates/CMA (1.53 DS) superhelix, (b) upon encapsulation of DASP-$C_{22}$ by the super-helix, accompanied by an enhancement at 605 nm (upward arrow), (c) upon encapsulation of DASP-DASP-$_6V_{12}$ by the super-helix, accompanied by decreased intensity (downward broken arrows), and (d) of the CMA (1.53 DS)/DASP-$_6V_{12}$ mixture; [cyanine]=2.3×10$^{-5}$ M, [CMA (1.53 DS)]=0.9×10$^{-3}$ M, and [DASP-$C_{22}$]=[DASP-$_6V_{12}$]=1.7×10$^{-5}$ M in $H_2O$. (right) Time-resolved fluorescence lifetimes of the photoexcited species; the lifetimes were detected at 475 nm for $\tau_1$, $\tau_2$, and $\tau_3$ and at 605 nm for $\tau_4$ and $\tau_5$ ($\tau$ values are shown as an average).
Figure 8:
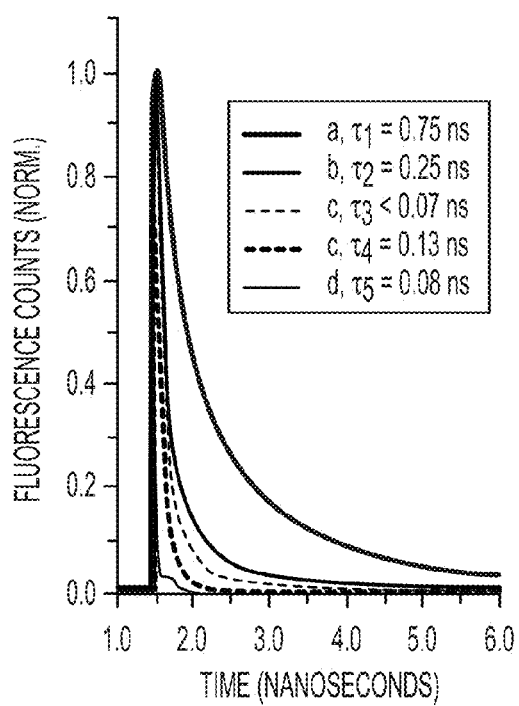

A time-resolved fluorescence decay profile of the excited state species along the transport pathways is illustrated in FIG. 8 (right). This demonstrates that when detected at 475 nm, the fluorescence lifetime ($\tau_1$) of the J-aggregates (of the super-helix) is decreased by a factor of 5 due to ET quenching ($\tau_2$) by DASP-C$_{22}$, and the subsequent eT quenching by the $_6$V$_{12}$ subunit further decreases the lifetime ($\tau_3$) by at least another factor of 3 Such a dramatic shortening of J-aggregates lifetime is a clear indication of ET/eT along the pathways. Separately, when the decay was detected (for eT) at 605 nm (for $\tau_4$ or $\tau_5$), the $\tau_4$ is longer compared to the $\tau_3$. This is unclear but can be explained by that the DASP excited-state is interfered by a concomitant deactivation process (The $_6$V$_{12}$ subunit (inside the super-helix) in proximity to the J-aggregates (on the super-helix surface) can also quench the excitation of the J-aggregates directly, not through DASP subunit, such that $\tau_4$ (involving DASP to $_6$V$_{12}$ eT process) becomes longer compared to $\tau_3$ (involving the J-aggregate quenching by DASP subunit)) involving a direct eT to the $_6$V$_{12}$ subunit (in encapsulation) from the excited J-aggregates. Nonetheless, the eT rate is still very fast: $k_e = 1/\tau_{D-A} - 1/\tau_D = 1.3 \times 10^{10}$ s$^{-1}$. However, compared to $\tau_4$, the unusually shortened $\tau_5$ (due to the free DASP-$_6$V$_{12}$ dissolved in the random-coil CMA solution) is not due to the efficient eT but is attributed to self-quenching (Pepitone et al., *Org. Lett.* 2007, 9, 801-804) resulting from aggregations, particularly due to CMA-mediated electrostatic binding of the free DASP-$_6$V$_{12}$ and/or non-radiative deactivation of the polar solvent (FIG. 5) (Ephardt et al., *J. Phys. Chem.* 1993, 97, 4540; Fromherz, *J. Phys. Chem.* 1995, 99, 7188).

Obviously, many modifications and variations are possible in light of the above teachings. It is therefore to be understood that the claimed subject matter may be practiced otherwise than as specifically described. Any reference to claim elements in the singular, e.g., using the articles "a," "an," "the," or "said" is not construed as limiting the element to the singular.

What is claimed is:

1. A structure comprising:
   a molecule of carboxymethyl amylose in a helical conformation having an exterior surface and an interior space;
   a plurality of cyanine molecules on the exterior surface arranged in a J-aggregate formation; and
   a chromophore molecule in the interior space;
   wherein the chromophore is

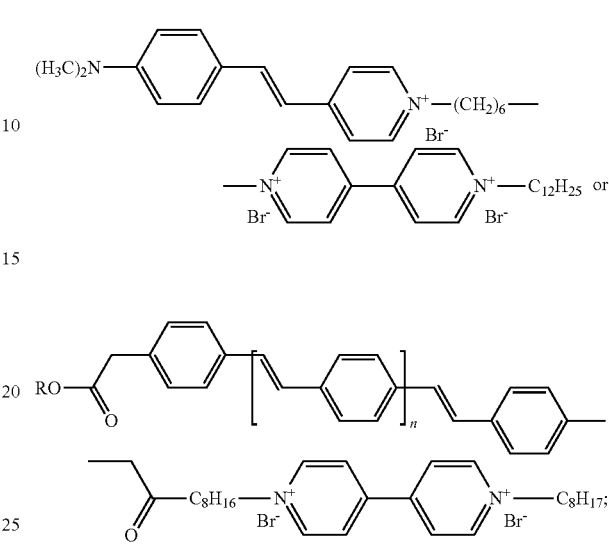

wherein n is 1, 2, or 3; and
   wherein R is H or an organic group.

2. The structure of claim 1, wherein the ratio of carboxymethyl substituted glucosidic units to unsubstituted glucosidic units in the carboxymethyl amylose is from about 0.05 to about 2.

3. The structure of claim 1, wherein the cyanine molecule is

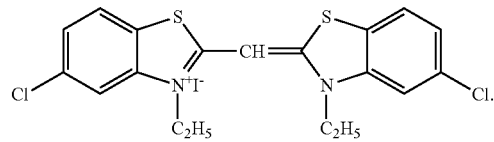

4. A photovoltaic device comprising:
   one or more of the structure of claim 1;
   an anode in electrical contact with an electron donating portion of the chromophore; and
   a cathode in electrical contact with an electron accepting portion of the chromophore.

5. The photovoltaic device of claim 4, further comprising:
   a transparent substrate;
      wherein at least one of the anode and the cathode is transparent and in contact with the substrate.

6. The structure of claim 1, wherein the carboxymethyl amylose has an average number of carboxymethyl substitutions per glucose unit of at least 0.1.

7. The structure of claim 1, wherein the carboxymethyl amylose has an average number of carboxymethyl substitutions per glucose unit of at most 0.1.

* * * * *